US011721377B2

(12) United States Patent
Tang

(10) Patent No.: US 11,721,377 B2
(45) Date of Patent: *Aug. 8, 2023

(54) METHOD FOR READING AND WRITING MEMORY CELLS IN THREE-DIMENSIONAL FERAM

(71) Applicant: Yangtze Memory Technologies Co., Ltd., Hubei (CN)

(72) Inventor: Qiang Tang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/492,305

(22) Filed: Oct. 1, 2021

(65) Prior Publication Data

US 2022/0020413 A1  Jan. 20, 2022

Related U.S. Application Data

(63) Continuation of application No. 17/001,967, filed on Aug. 25, 2020, now Pat. No. 11,170,836, which is a
(Continued)

(51) Int. Cl.
*G11C 11/22* (2006.01)
*G11C 16/00* (2006.01)
(Continued)

(52) U.S. Cl.
CPC ........ *G11C 11/223* (2013.01); *G11C 11/2273* (2013.01); *G11C 11/2275* (2013.01);
(Continued)

(58) Field of Classification Search
None
See application file for complete search history.

(56) References Cited

U.S. PATENT DOCUMENTS 5,375,085 A   12/1994   Gnade et al.
6,804,140 B2  10/2004   Lin et al.
(Continued)

FOREIGN PATENT DOCUMENTS

CN   1527321 A    9/2004
CN   1700473 A   11/2005
(Continued)

OTHER PUBLICATIONS

International Search Report of the International Searching Authority directed to related International Patent Application No. PCT/CN2020/100210, dated Apr. 2, 2021; 4 pages.
(Continued)

*Primary Examiner* — Tan T. Nguyen
(74) *Attorney, Agent, or Firm* — Sterne, Kessler, Goldstein & Fox P.L.L.C.

(57) ABSTRACT

A programming method for a three-dimensional ferroelectric memory device is disclosed. The programming method includes applying a first voltage on a selected word line of a target memory cell. The target memory cell has a first logic state and a second logic state corresponding to a first threshold voltage and a second threshold voltage, respectively. The first and second threshold voltages are determined by two opposite electric polarization directions of a ferroelectric film in the target memory cell. The programming method also includes applying a second voltage on a selected bit line, where a voltage difference between the first and second voltages has a magnitude larger than a coercive voltage of the ferroelectric film such that the target memory cell is switched from the first logic state to the second logic state.

19 Claims, 10 Drawing Sheets

Related U.S. Application Data continuation of application No. PCT/CN2020/100210, filed on Jul. 3, 2020.

(51) Int. Cl.
  *H10B 51/10* (2023.01)
  *H10B 51/20* (2023.01)
  *H10B 51/30* (2023.01)

(52) U.S. Cl.
  CPC ............ *H10B 51/10* (2023.02); *H10B 51/20* (2023.02); *H10B 51/30* (2023.02)

(56) References Cited

U.S. PATENT DOCUMENTS

| | | | |
|---|---|---|---|
| 7,099,173 B2 | 8/2006 | Koide | |
| 7,463,502 B2 | 12/2008 | Stipe | |
| 8,953,359 B2 * | 2/2015 | Shuto | G11C 11/2275 365/185.01 |
| 9,613,676 B1 | 4/2017 | Wang et al. | |
| 10,109,350 B2 | 10/2018 | Chen | |
| 10,210,921 B1 | 2/2019 | Hwang | |
| 10,431,281 B1 | 10/2019 | Fackenthal et al. | |
| 11,170,836 B1 * | 11/2021 | Tang | H01L 27/1159 |
| 11,475,964 B2 | 10/2022 | Li et al. | |
| 2003/0218899 A1 | 11/2003 | Jeon et al. | |
| 2004/0174729 A1 | 9/2004 | Sakai et al. | |
| 2005/0259461 A1 | 11/2005 | Yamaoka et al. | |
| 2006/0056225 A1 | 3/2006 | Hashimoto et al. | |
| 2006/0133129 A1 | 6/2006 | Rodriguez et al. | |
| 2006/0215438 A1 | 9/2006 | Suzuki | |
| 2007/0236979 A1 | 10/2007 | Takashima | |
| 2009/0173978 A1 | 7/2009 | Kato | |
| 2012/0051136 A1 | 3/2012 | Kang et al. | |
| 2016/0181259 A1 | 6/2016 | Van Houdt et al. | |
| 2018/0358380 A1 | 12/2018 | Yoo | |
| 2020/0119047 A1 * | 4/2020 | Yoo | H01L 27/11597 |
| 2020/0144293 A1 | 5/2020 | Hi et al. | |
| 2021/0091204 A1 * | 3/2021 | Rabkin | H01L 27/11587 |
| 2021/0265375 A1 | 8/2021 | Sun et al. | |

FOREIGN PATENT DOCUMENTS

| | | |
|---|---|---|
| CN | 101256840 A | 9/2008 |
| CN | 203521478 U | 4/2014 |
| CN | 107665720 A | 2/2018 |
| CN | 108986865 A | 12/2018 |
| CN | 109461736 A | 3/2019 |
| CN | 109716282 A | 5/2019 |
| CN | 109716521 A | 5/2019 |
| CN | 110071117 A | 7/2019 |
| CN | 110189777 A | 8/2019 |
| CN | 110189783 A | 8/2019 |
| TW | 202203223 A | 1/2022 |

OTHER PUBLICATIONS

Chinese Office Action directed to Chinese Patent Application No. 202111004071.5, dated Apr. 29, 2023; 18 pages.

* cited by examiner

METHOD FOR READING AND WRITING MEMORY CELLS IN THREE-DIMENSIONAL FERAM

CROSS-REFERENCE TO RELATED APPLICATIONS AND INCORPORATION BY REFERENCE

This application is a continuation of U.S. patent application Ser. No. 17/001,967 filed on Aug. 25, 2020 and titled "Method for Reading and Writing Memory Cells in Three-dimensional FeRAM," which claims priority to PCT/CN2020/100210 filed on Jul. 3, 2020, all of which are incorporated herein by reference in their entirety.

TECHNICAL FIELD

The present disclosure generally relates to the field of semiconductor technology, and more particularly, to a method for reading and writing memory cells in a three-dimensional (3D) Ferroelectric Random Access Memory (FeRAM).

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, memory cells can be programmed for data storage based on charge-trapping technology. The storage information of a memory cell depends on the amount of charge trapped in a storage layer. Although 3-D NAND memory can be high density and cost-effective, it suffers from low write speed and high power consumption at system level due to required periphery (e.g., charge pumps). Therefore, a need exists to resolve these issues while keeping the advantages of the 3D NAND technology.

Ferroelectric Random Access Memory (FeRAM) is a high performance and low-power non-volatile memory that can combines the benefits of conventional non-volatile memories (Flash and EEPROM) and high-speed RAM (SRAM and DRAM.) FeRAM can outperform existing memories like EEPROM and Flash with less power consumption, faster response, and greater endurance to multiple read-and-write operations. However, traditional planar FeRAM is difficult to scale down. Signal margin of a FeRAM decreases with reduced cell area because it is challenging to increase the intrinsic polarization of ferroelectric material. By replacing the charge trapping storage layer in a 3D NAND flash memory with a ferroelectric material (e.g., Si:HfO$_2$), a 3D ferroelectric NAND flash memory can be formed. The effective area of the ferroelectric material in the 3D structure can be much larger than the unit area of the memory cell. Thus, a 3D FeRAM can have scalable dimensions without performance penalty. The object of the present disclosure is to provide various methods for reading and writing the ferroelectric memory cells in a 3D FeRAM.

BRIEF SUMMARY

Embodiments of methods for reading and writing of memory cells in a three-dimensional (3D) ferroelectric memory device is described in the present disclosure.

One aspect of the present disclosure provides a reading method of a three-dimensional ferroelectric memory device. The reading method includes applying a read voltage on a selected word line of a target memory cell. The target memory cell has two logic states corresponding to a higher threshold voltage and a lower threshold voltage that are determined by two opposite electric polarization directions of a ferroelectric film in the target memory cell. The read voltage is smaller than the higher threshold voltage and is larger than the lower threshold voltage. The reading method further includes measuring an electric current that flows through the target memory cell.

In some embodiments, the reading method also includes electrically connecting a selected memory string to a bit line and to an array common source. The selected memory string has a first plurality of stacked memory cells that include the target memory cell. The electric current is measured at the bit line.

In some embodiments, the reading method further includes applying a pass voltage on an unselected word line. In some embodiments, the applying the pass voltage on the unselected word line includes applying the pass voltage with a magnitude larger than the higher threshold voltage to switch on all memory cells on the unselected word line. The applying the pass voltage also includes applying the pass voltage with the magnitude smaller than a coercive voltage of the ferroelectric film such that the electric polarization direction is not switched.

Another aspect of the present disclosure provides a programming method of a three-dimensional ferroelectric memory device. In some embodiments, the programming method includes applying a first voltage on a selected word line of a target memory cell. The target memory cell includes a first logic state and a second logic state corresponding to a first threshold voltage and a second threshold voltage, respectively. The first and second threshold voltages are determined by two opposite electric polarization directions of a ferroelectric film in the target memory cell. The programming method also includes applying a second voltage on a selected bit line that is connected to a drain terminal of the target memory cell. A voltage difference between the first and second voltages has a magnitude larger than a coercive voltage of the ferroelectric film to switch the target memory cell from the first logic state to the second logic state.

In some embodiments, the switching the target memory cell from the first logic state to the second logic state includes switching the electric polarization direction to an opposite direction.

In some embodiments, the applying the first and second voltages includes applying voltages with opposite signs and same magnitudes. In some embodiments, the first voltage can be a positive voltage, and the second voltage can be a negative voltage. The switching the target memory cell from the first logic state to the second logic state includes switching the target memory cell from the first threshold voltage to the second threshold voltage, the first threshold voltage is higher than the second threshold voltage.

In some embodiments, the first voltage can be a negative voltage, and the second voltage can be a positive voltage. In some embodiments, the switching the target memory cell from the first logic state to the second logic state includes switching the target memory cell from the first threshold voltage to the second threshold voltage. The first threshold voltage is lower than the second threshold voltage.

In some embodiments, the programming method further includes applying a pass voltage on an unselected word line. The pass voltage is higher than the first and second threshold voltages and has a magnitude smaller than the coercive voltage of the ferroelectric film. In some embodiments, the pass voltage is applied on an unselected bit line. A second voltage difference between the first voltage and the pass voltage includes a magnitude smaller than the coercive voltage of the ferroelectric film. An unselected memory cell is inhibited to switch between the first and second logic states.

In some embodiments, the first and second voltages can be voltage pulses with durations in a range between 10 ns to 100 μs.

In some embodiments, the first and second voltages can have magnitudes in a range between about 1.5V to about 5V.

In some embodiments, the programming method also includes switching on a lower select transistor that is connected to a source terminal of the target memory cell and an array common source, and applying the second voltage on the array common source.

In some embodiments, the programming method further includes switching off a lower select transistor that is connected to a source terminal of the target memory cell.

In some embodiments, the programming method further includes switching on a top select transistor that is connected to the drain terminal of the target memory cell and the selected bit line.

Another aspect of the present disclosure provides a three-dimensional ferroelectric memory device. The memory cell of the three-dimensional ferroelectric memory device comprises a ferroelectric film. The memory cell comprises a first logic state and a second logic state corresponding to a first threshold voltage and a second threshold voltage, respectively. The first and second threshold voltages can be determined by two opposite electric polarization directions of the ferroelectric film. The memory cell is configured to be programmed by applying a first voltage on a selected word line and applying a second voltage on a selected bit line, wherein a voltage difference between the first voltage and the second voltage comprises a magnitude larger than a coercive voltage of the ferroelectric film to switch the memory cell from the first logic state to the second logic state.

In some embodiments, the first voltage can be a positive voltage, the second voltage can be a negative voltage, and the first threshold voltage can be higher than the second threshold voltage.

In some embodiments, the first voltage can be a negative voltage, the second voltage can be a positive voltage, and the first threshold voltage can be lower than the second threshold voltage.

In some embodiments, the three-dimensional ferroelectric memory device also includes a film stack of alternating conductive and dielectric layers, and a plurality of memory strings extending vertically through the film stack, wherein the plurality of memory strings each has one or more of the memory cell.

In some embodiments, the memory cell further includes a core filling film surrounded by a channel layer and the ferroelectric film.

In some embodiments, the memory cell also includes an interface layer between the ferroelectric film and the channel layer.

In some embodiments, the memory cell also includes a bottom electrode between the ferroelectric film and the channel layer.

In some embodiments, the memory cell is at a higher threshold voltage when the ferroelectric film has an electric polarization with a direction pointing from the channel layer to the conductive layer. The memory cell is at a logic state of 0.

In some embodiments, the memory cell is at a lower threshold voltage when the ferroelectric film has an electric polarization with a direction pointing from the conductive layer to the channel layer. The memory cell is at a logic state of 1.

In some embodiments, the ferroelectric film has a thickness between 5 nm and 100 nm.

In some embodiments, the ferroelectric film includes a high-k dielectric material. The high-k dielectric material includes hafnium oxide ($HfO_2$), aluminum oxide ($Al_2O_3$), Zirconium oxide ($ZrO_2$), titanium oxide ($TiO_2$), niobium oxide ($Nb_2O_5$), tantalum oxide ($Ta_2O_5$), tungsten oxide ($WO_3$), molybdenum oxide ($MO_3$), vanadium oxide ($V_2O_3$), lanthanum oxide ($La_2O_3$), and/or any combination thereof.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
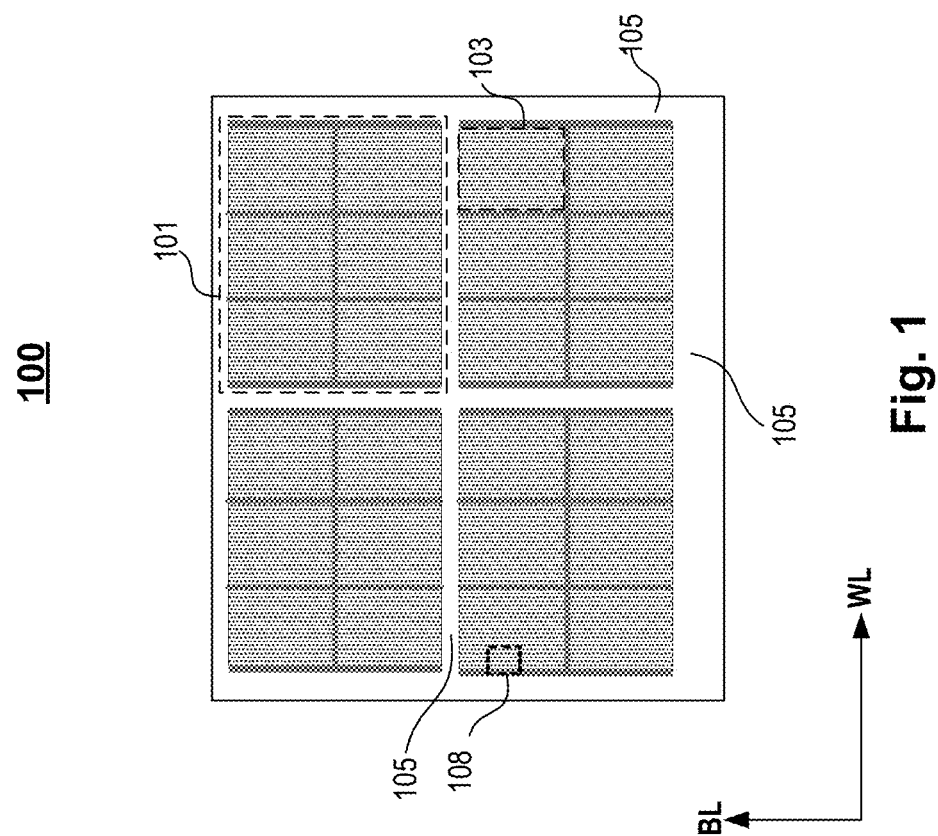
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
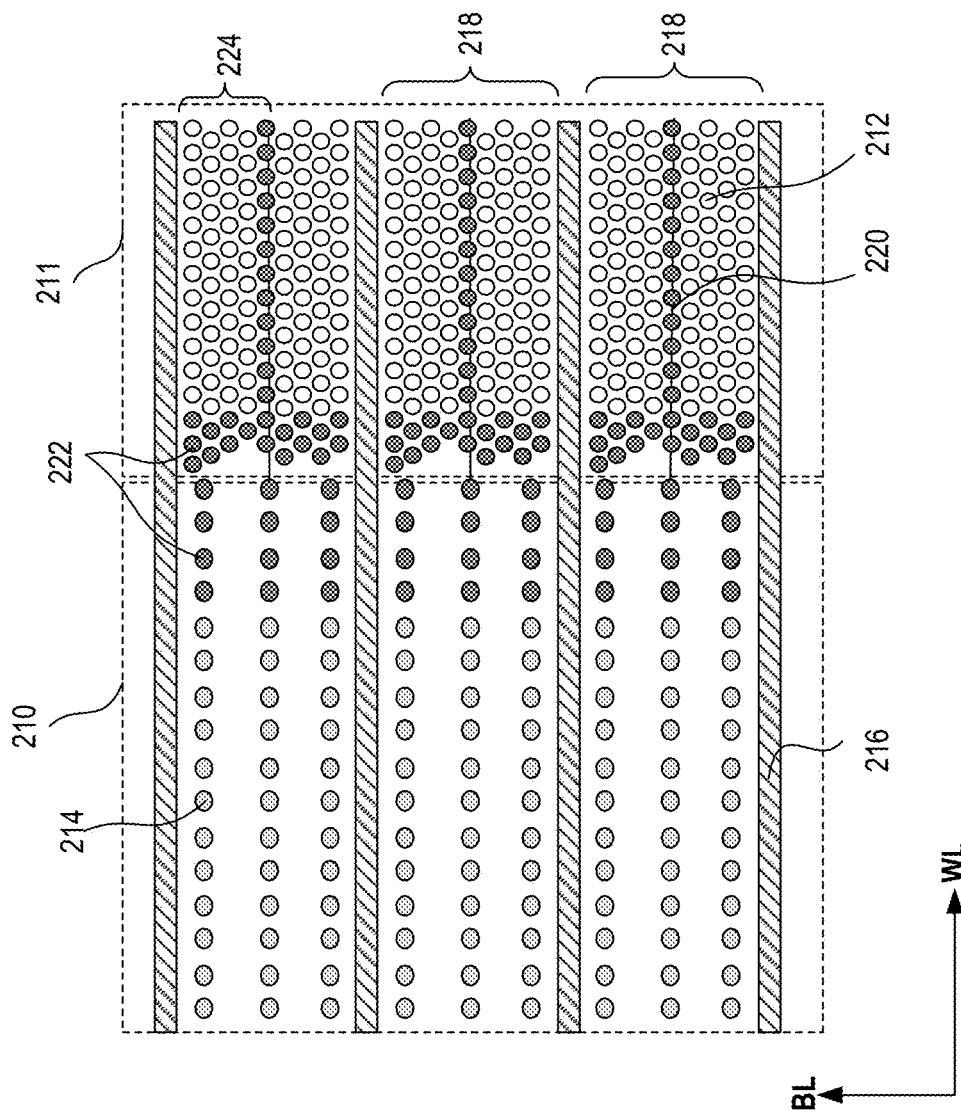
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact (e.g., array common source) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
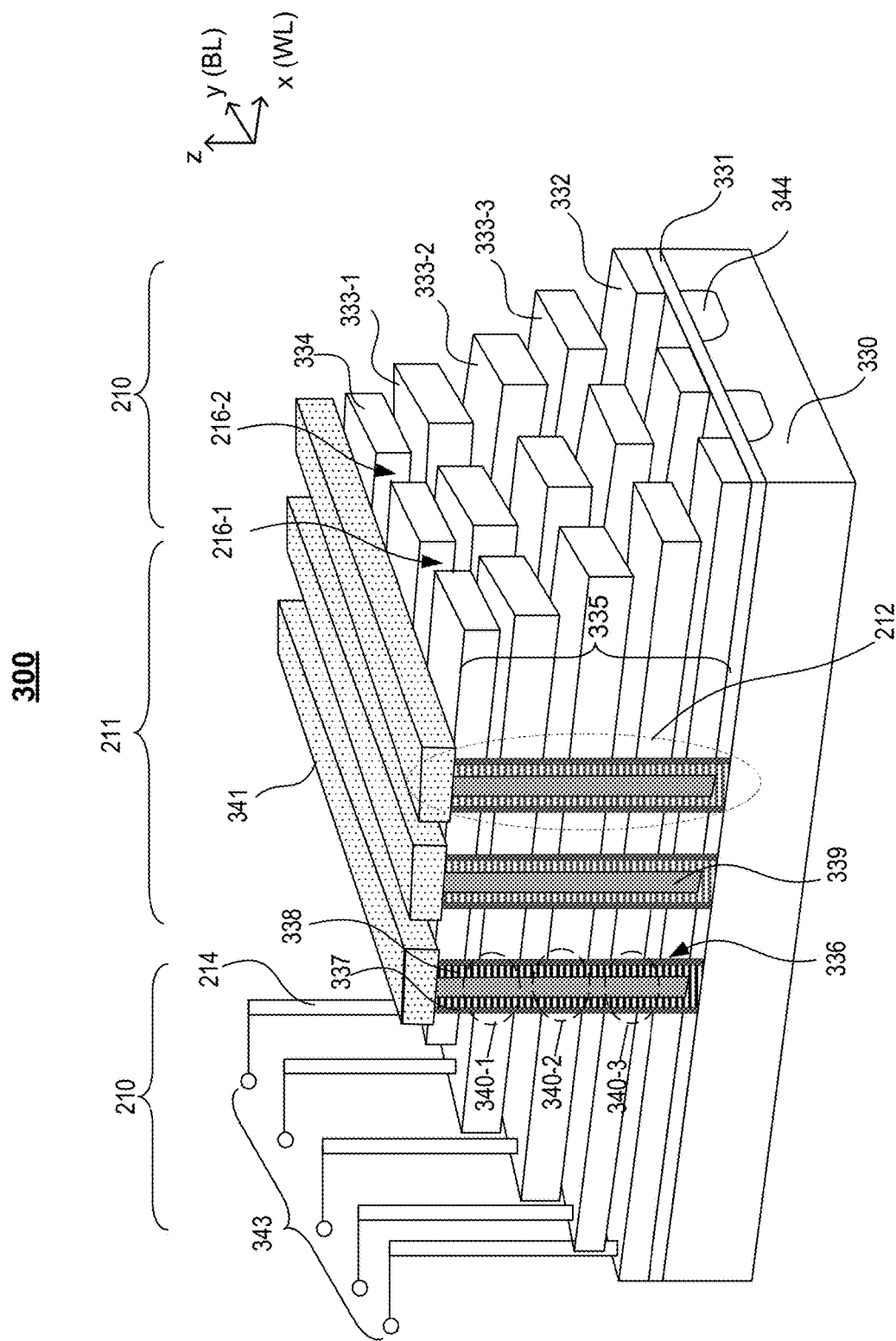
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

While floating gate memory cells and charge trapping technology have been traditionally utilized in flash memories, ferroelectric random access memories (FeRAMs) can provide low-voltage and low-power operation, fast write, non-volatility, and high cycling endurance.

Ferroelectricity is a property observed in non-centrosymmetric dielectric crystals that show a spontaneous electric polarization, where the direction of polarization can be changed by an externally applied electric field. In a ferroelectric material, some atoms in the unit cell are misplaced to create a permanent electric dipole due to the distribution of electric charge. A macroscopic manifestation of the charge separation is the surface charge of the ferroelectric material, described by an electric polarization P. Typical ferroelectric materials, such as Lead Zirconate Titanate (PZT), Strontium Bismuth Tantalate ($SrBi_2Ta_2O_9$ or SBT), Barium Titanate ($BaTiO_3$) and $PbTiO_3$, have perovskite-type crystal structure, where the cation in the center of the unit cell has two positions, both being stable low-energy states. The two low-energy states correspond to two opposite directions of the electric dipole. Under an external electric field, the cation can move in the direction of the electric field. Thus, by applying an external electric field across the crystal, cation in the unit cell can be moved from one low-energy position to another low-energy position and the direction of the electric dipole can be flipped if the applied electric field is high enough. As a result, the electric polarization P in the ferroelectric material can be aligned with the direction of the external electric field.

Figure 4:
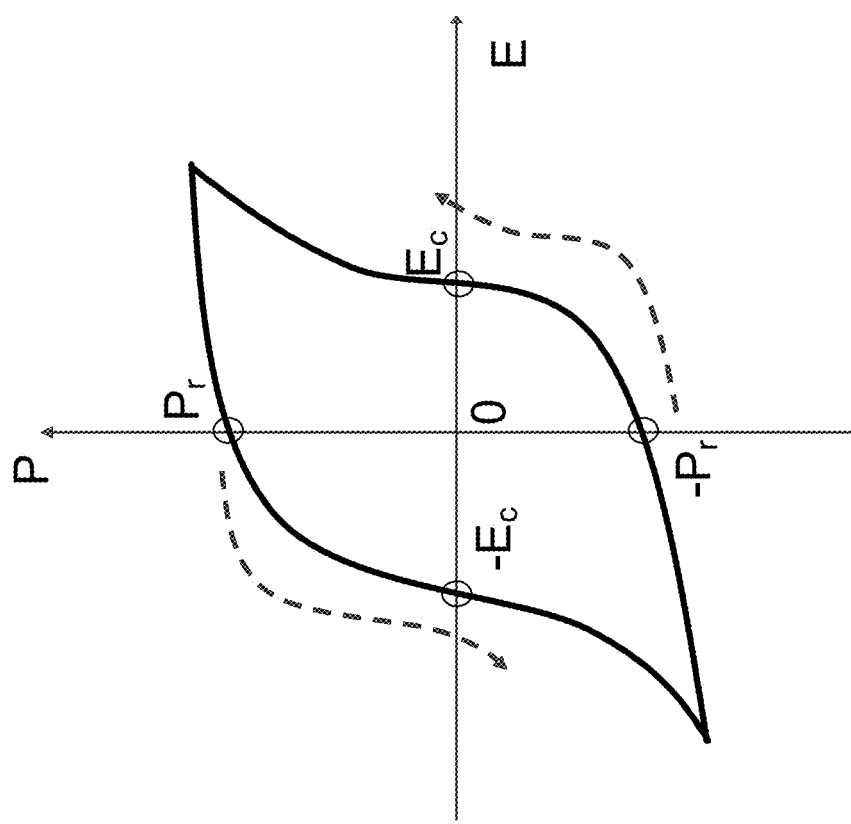
FIG. 4 illustrates an exemplary polarization characteristics of a ferroelectric material as a function of applied electrical field, according to some embodiments of the present disclosure.

FIG. 4 illustrates an exemplary electric polarization P of a ferroelectric material as a function of applied electrical field E, where a remnant polarization $P_r$ (or a reversed remnant polarization $-P_r$) of the ferroelectric material can be measured at zero external electric field. As shown in FIG. 4, the change of the electric polarization with an applied electric field follows a hysteresis loop. When a positive electric field is applied across the ferroelectric material, it is polarized positively until its electric polarization P changes linearly with applied electric field E.

When the external electric field is removed, the electric polarization (also referred to polarization in this disclosure) in the ferroelectric material does not disappear. When the external electric field is removed after the ferroelectric material has been fully polarized, the remaining polarization in the ferroelectric material is the remnant polarization $P_r$.

Applying a reverse electric field does not un-polarize the ferroelectric material until it reaches the reversed coercive field $-E_c$. Here, the negative sign shows the reversed direction of the electric field, and the magnitude is represented by $E_c$, where at the left-side of the loop the polarization P reaches zero. Continuingly increasing the magnitude of the negative electric field, the ferroelectric material can be fully polarized in the negative direction. When the negative electric field is removed, the ferroelectric material has the reversed remnant polarization $-P_r$, in the negative direction.

Applying a positive electric field from then on, and passing the coercive field $E_c$ in the positive direction, the polarization in the ferroelectric material can be flipped to positive direction again until it is fully polarized to follow linearly with the electric field. The hysteresis loop can be repeated numerous times to alter the polarization direction of the ferroelectric, often more than $10^{16}$ cycles depending on the material.

The ferroelectric polarization is non-volatile in that once the polarization is generated, the external electric field is unable to change the polarization direction until the magnitude of the electric field reaches a threshold (i.e., the coercive field $E_c$ or reversed coercive field $-E_c$). A ferroelectric memory (FeRAM) uses the polarization reversal or switching effect and stores digital bits "0" and "1" according to the directions of the spontaneous polarization.

In a FeRAM, the ferroelectric material can be implemented as a capacitor, consisting P of a thin ferroelectric film sandwiched in between two conductive electrodes. To write, a programming voltage $V_p$ can be applied to one end of the capacitor and the other end of the capacitor can be grounded. The polarization direction of the ferroelectric material can be switched when the programming voltage $V_p$ changes from positive to negative or vice versa. And the capacitor can be set or reset to a logic state of "1" or "0." Here, the programming voltage $V_p$ needs to be higher than a coercive voltage $V_c$, where $V_c = d_f \times E_c$ and $d_f$ is the thickness of the ferroelectric material. For example, the coercive field $E_c$ of an $HfO_2$-based ferroelectric material can be about 1 MV/cm, while the coercive field $E_c$ of PZT or SBT can be about 50 kV/cm. While large coercive field $E_c$ can provide large memory window (about $2 \cdot E_c$) between two memory states (see FIG. 4), smaller coercive voltage $V_c$ can reduce operation power and energy consumption. In some embodiments, the thickness $d_f$ of the $HfO_2$-based ferroelectric material can be scaled down to a range between 5 nm and 50 nm. Accordingly, the coercive voltage $V_c$ of the $HfO_2$-based ferroelectric material can be in a range between 0.5 V and 5 V. In some embodiments, the programming voltage $V_p$ can have a magnitude in a range between about 3V to about 10V. In some embodiments, the programming voltage $V_p$ can be a voltage pulse with a duration in a range between 10 ns to 100 µs.

In a FeRAM, the ferroelectric material can also be implemented as a ferroelectric field-effect-transistor (FeFET). In a three-dimensional ferroelectric NAND (3D Fe-NAND), a memory cell can be formed by using a FeFET, where the storage information depends on polarization directions of the ferroelectric material in a storage layer (e.g., the gate dielectric of the transistor).

Figure 5:
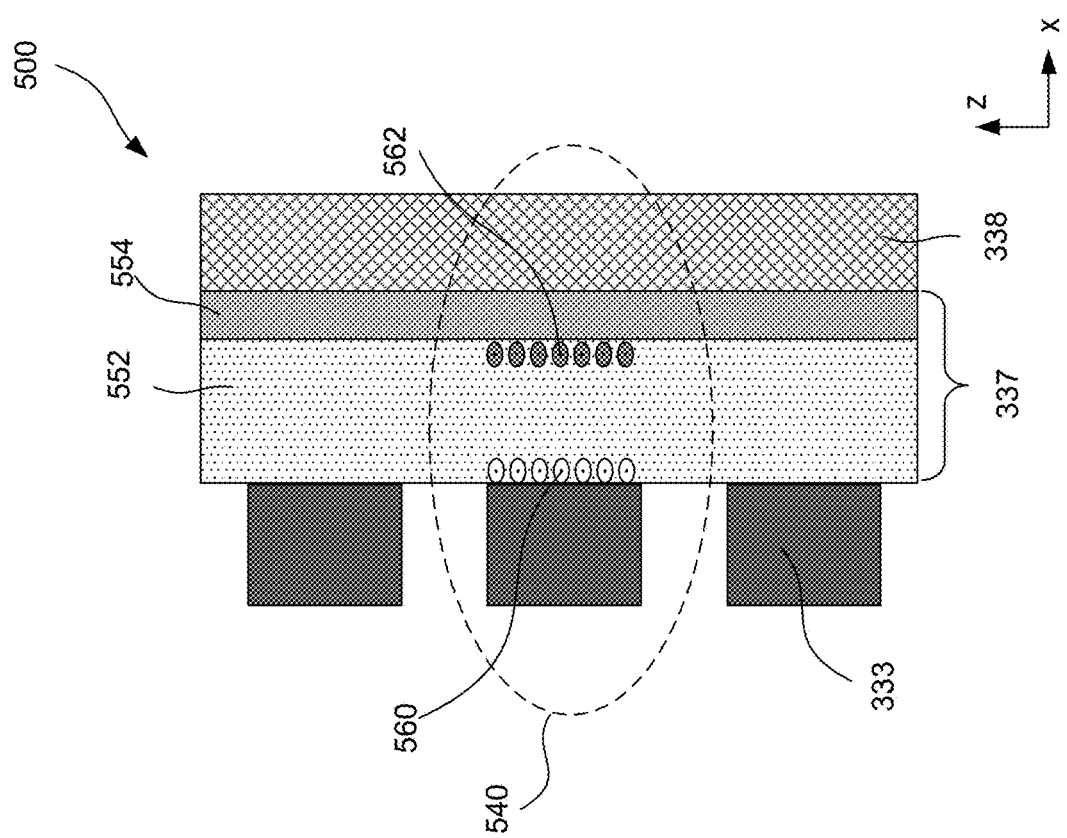
FIGS. 5 and 6 illustrate schematic cross-sectional views of 3D Fe-NAND memory structures, according to some embodiments of the present disclosure.

FIG. 5 illustrates a schematic cross-section of a 3D Fe-NAND memory structure 500, according to some embodiments of the present disclosure. The 3D Fe-NAND memory structure 500 includes a ferroelectric memory cell 540 having a vertical structure similar to the memory cell 340 of the 3D NAND in FIG. 3. The ferroelectric memory cell 540 can include a FeFET having a control gate (similar to the control gate 333), a memory film (similar to the memory film 337) and a channel layer (similar to the channel layer 338).

In the 3D Fe-NAND memory structure 500, the memory film 337 can be disposed on a sidewall of each channel hole 336 (illustrated in FIG. 3), where the memory film 337 can include a ferroelectric film 552. In some embodiments, the ferroelectric film 552 can include a high-k (i.e., high dielectric constant) dielectric material, which can include transitional metal oxides such as hafnium oxide ($HfO_2$), aluminum oxide ($Al_2O_3$), Zirconium oxide ($ZrO_2$), titanium oxide ($TiO_2$), niobium oxide ($Nb_2O_5$), tantalum oxide ($Ta_2O_5$), tungsten oxide ($WO_3$), molybdenum oxide ($MO_3$), vanadium oxide ($V_2O_3$), lanthanum oxide ($La_2O_3$), and/or any combination thereof. In some embodiments, to improved ferroelectric property, the high-k dielectric material can be doped. For example, the ferroelectric film 552 can be $HfO_2$ doped with silicon (Si), (Yttrium) Y, Gadolinium (Gd), Lanthanum (La), Zircomium (Zr) or Aluminum (Al), or any combination thereof.

In some embodiments, the ferroelectric film 552 can include Zirconate Titanate (PZT), Strontium Bismuth Tantalate ($SrBi_2Ta_2O_9$), Barium Titanate ($BaTiO_3$), $PbTiO_3$, and BLT (($Bi,La)4Ti3O12$), or any combination thereof.

In some embodiments, the ferroelectric film 552 can be disposed by chemical vapor deposition (CVD), for example, metal organic chemical vapor deposition (MOCVD), low pressure chemical vapor deposition (LPCVD), plasma enhanced chemical vapor deposition (PECVD), high-density plasma chemical vapor deposition (HDP-CVD), etc. The ferroelectric film 552 can also be disposed by atomic layer deposition (ALD), sputtering, evaporating, or any combination thereof.

In some embodiments, the ferroelectric film 552 can have a thickness in a range between 5 nm and 100 nm.

As shown in FIG. 5, the ferroelectric memory cell 540 (also referred to as the FeFET 540) can include a FeFET having a structure similar to a metal oxide semiconductor field effect transistor (MOSFET), where the gate (i.e., the control gate 333) and the channel (i.e., the channel layer 338) of the transistor is separated by the ferroelectric film 552. When the programming voltage $V_p$ applied on the control gate 333 provides a positive voltage across the ferroelectric film 552 that is larger than the coercive voltage ($V_p > V_c$), the ferroelectric film 552 can have the positive remnant polarization $P_r$, with a direction pointing from the control gate 333 to the channel layer 338. As a result, top surface charges 560 near the control gate 333 are negative and bottom surface charges 562 near the channel layer 338 are positive. The positive bottom surface charges 562 near the channel can lower the threshold voltage $V_{th}$ of the transistor. Therefore, the ferroelectric memory cell 540 can be programmed to a lower threshold voltage $V_{th\_L}$, and set to a logic state of "1."

On the other hand, when a reversed programming voltage $-V_p$ (e.g., negative voltage) is applied on the control gate 333 with a magnitude larger than the reversed coercive voltage (i.e., $|-V_p|>|-V_c|$), the ferroelectric film 552 can be negatively polarized to have the reversed remnant polarization $-P_r$, with a direction pointing from the channel layer 338 to the control gate 333. The top surface charges 560 near the control gate 333 are positive and bottom surface charges 562 near the channel layer 338 are negative. The negative bottom surface charges 562 near the channel increase the threshold voltage $V_{th}$ of the transistor. Therefore, the ferroelectric memory cell 540 can be programmed to a higher threshold voltage $V_{th\_H}$, and reset to a logic state of "0."

It is noted that the coercive field $E_c$, the coercive voltage $V_c$, the programming voltage $V_p$ and the remnant polarization $P_r$ are not necessarily be symmetric around zero. Positive and negative values can have different magnitude. To simplify discussion below, it is assumed that the magnitudes are the same in the reversed direction. A person of ordinary skill in the art should be able to apply the methods below for general conditions.

As discussed above, by applying suitable voltage pulses on the control gate 333, polarization direction of the ferroelectric film 552 can be switched and threshold voltage of the ferroelectric memory cell 540 can be changed, which impact the conductance of the channel layer 338 and the on/off state of the FeEET 540. The logic states (or the storage data) of the ferroelectric memory cell 540 can be determined accordingly.

By applying a reading voltage $V_{read}$ on the control gate 333, the conductance of the channel layer 338 can be measured from the source/drain terminals of the ferroelectric memory cell 540. The logic state or the threshold voltage of the ferroelectric memory cell 540 can be verified. Compared with traditional 3D NAND where the memory cells are operated based on charge trapping in the memory film, the ferroelectric memory cells 540 are controlled by polarization in the ferroelectric film 552 instead.

In some embodiments, the ferroelectric memory cell 540 can also include an interface layer 554 between the ferroelectric film 552 and the channel layer 338. The interface layer 554 can be used to reduce the possibility of material intermixing between the ferroelectric film 552 and the channel layer 338. In this example, the effective gate dielectric of the FeFET is the combination of the ferroelectric film 552 and the interface layer 554. Thinner effective gate dielectric can provide better control of the channel layer 338 from the control gate 333. Thus, a thickness of the interface layer 554 can be in a range between about 5 nm and about 50 nm. In some embodiment, the interface layer 554 can be silicon oxide, silicon nitride, silicon oxynitride, high-k dielectric material (e.g., $HfO_2$, HfAlO, $Al_2O_3$), and/or any combination thereof. The interface layer 554 can be disposed by any suitable film deposition technique such as ALD, CVD, evaporation, and/or any combination thereof. The interface layer 554 can also be formed by oxidation, nitridation, and/or a combination thereof.

In some embodiment, the ferroelectric memory cell 540 can further include a barrier layer (not shown in FIG. 5) between the control gate 333 and the ferroelectric film 552. The barrier layer can be disposed on a sidewall of the channel hole 336 prior to disposing the memory film 337 in FIG. 3. The barrier layer can be used to block the interactions between the ferroelectric film 552 and the control gate 333. The barrier layer can have a thickness in a range between about 5 nm and about 50 nm. The barrier layer can include silicon oxide, silicon nitride, silicon oxynitride, high-k dielectric materials (e.g., $HfO_2$, $Al_2O_3$), and/or any combination thereof.

In a 3D Fe-NAND memory, the channel layer 338 can be disposed on a sidewall of the memory film 337 in the channel hole 336 (in FIG. 3). The channel layer 338 can include amorphous silicon, polycrystalline silicon, monocrystalline silicon, and/or any combination thereof. The channel layer 338 can be disposed by any suitable thin film deposition technique such as ALD, CVD, sputtering, etc.

Figure 6:
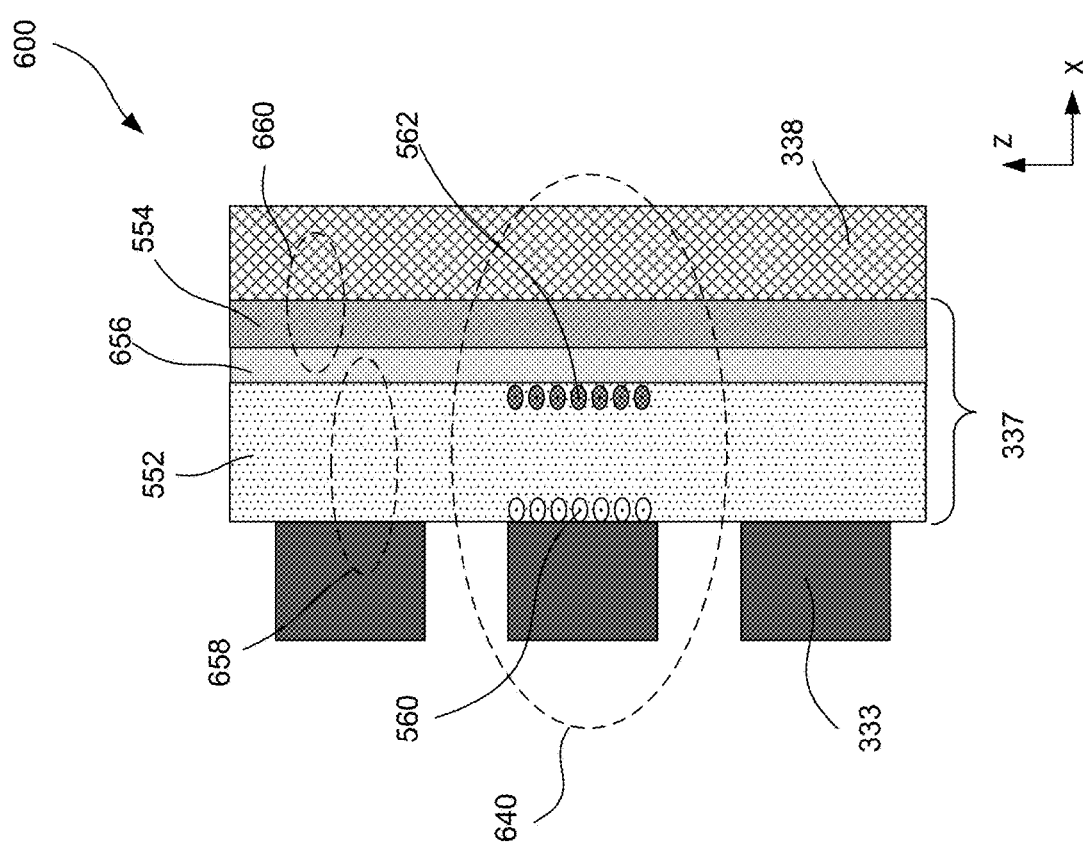

FIG. 6 illustrates a schematic cross-section of a 3D Fe-NAND memory structure 600, according to some embodiments of the present disclosure. The 3D Fe-NAND memory structure 600 includes a second ferroelectric memory cell 640 that is similar to the ferroelectric memory cell 540 in FIG. 5, which also includes the control gate 333, the ferroelectric film 552 and the channel layer 338. The 3D Fe-NAND memory structure 600 can also include the interface layer 554 and the barrier layer (not shown in FIG. 6). In some embodiments, the second ferroelectric memory cell 640 further includes a bottom electrode 656 between the ferroelectric film 552 and the interface layer 554. In this example, the control gate 333, the ferroelectric film 552, and the bottom electrode 656 forms a metal-insulator-metal (MIM) capacitor 658 that is in series with a floating gate transistor (FG-MOSFET) 660 where the bottom electrode 656 functions as a floating gate and the interface layer 554 functions as a gate dielectric. The 3D Fe-NAND memory structure 600 is formed based on similar polarization switching method as the 3D Fe-NAND memory structure 500 in FIG. 5 and has similar memory functions too. The voltage of the bottom electrode 656 is determined by the number of bottom surface charges 562 of the ferrorelectric film 552. By switching the polarization direction in the ferroelectric film 552, the number of bottom surface charges 562 can be changed, and the voltage of the bottom electrode 656 can be changed accordingly. Thus, the threshold voltage of the FG-MOSFET 660 can be changed. The bottom electrode 656 in the second ferroelectric memory cell 640 provides similar functions as a floating gate in a traditional NAND memory, except that the voltage of the bottom electrode 656 in the second ferroelectric memory cell 640 is controlled by the polarization of the ferroelectric film 552. The other difference between the 3D Fe-NAND memory structures 500 and 600 is that the applied voltage on the control gate 333 is divided between the MIM capacitor 658 and the FG-MOSFET 660. As a result, relatively larger voltage is necessary to switch the polarization of the ferroelectric film 552. To reduce writing voltage, a thinner ferroelectric film 552 is used in some embodiments. The MIM capacitor 658 can have larger capacitor from scaling the thickness $d_f$ of the ferroelectric film 552 such that a larger portion of the applied voltage can be dropped across the MIM capacitor 658.

Figure 7:
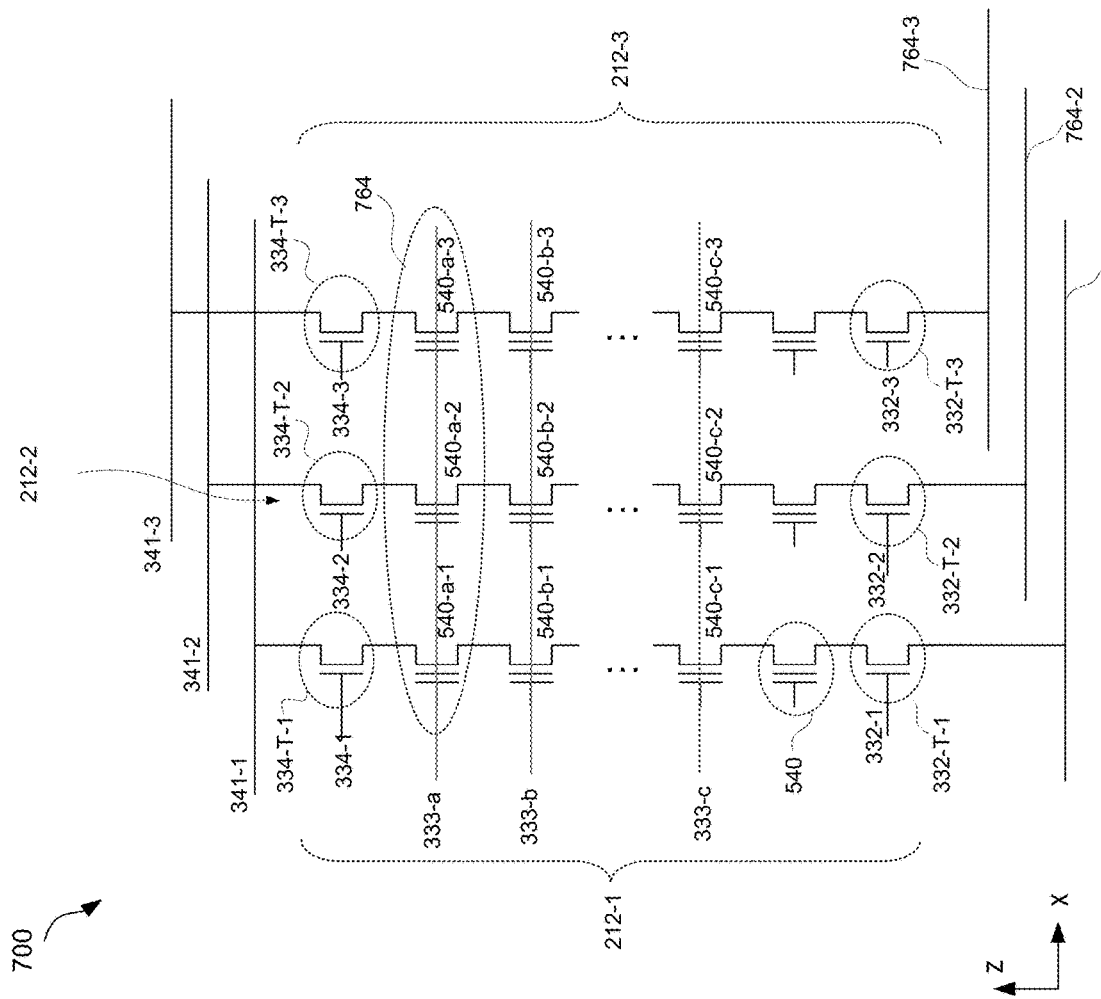
FIG. 7 illustrates a schematic circuit diagram of a 3D Fe-NAND memory, according to some embodiments of the present disclosure.

FIG. 7 illustrates a schematic circuit diagram of a 3D Fe-NAND memory array 700, according to some embodiments of the present disclosure. The 3D Fe-NAND memory array 700 is similar to the 3D memory array 103 as described previously in FIGS. 1-3, and also includes a plurality of memory strings 212 (e.g., memory strings 212-1, 212-2, 212-3, . . . ), each memory string 212 having a plurality of stacked memory cells (e.g., the ferroelectric memory cells 540 as shown in FIGS. 5 and 7, or the second ferroelectric memory cells 640 shown in FIG. 6). For illustration purpose, the ferroelectric memory cells 540 will be used as an example in the subsequent discussions for simplicity. However, the ferroelectric memory cells 540 can be replace by the second ferroelectric memory cells 640 in the discussions below.

In some embodiments, each memory string 212 also includes at least one field effect transistor (e.g., MOSFET) at each end, which is controlled by the lower select gate (LSG) 332 and the top select gate (TSG) 334, respectively. And the two respective transistors are referred to as lower and top select transistors 332-T and 334-T. The vertically stacked ferroelectric memory cells 540 can be controlled by the control gates 333, where the control gates 333 are connected to word lines of the 3D Fe-NAND memory array 700. Accordingly, the control gates 333 are also referred to as word lines 333 (e.g., the word line 333-*a*, 333-*b*, 333-*c*, etc.). The drain terminal of the top select transistor 334-T can be connected to the bit line 341 (e.g., the bit line 341-1, 341-2, 341-3, etc.), and the source terminal of the lower select transistor 332-T can be connected to the doped source line region 344 (see FIG. 3), from where an array common source (ACS) (e.g., 764-1, 764-2, 764-3, . . . ) can be formed. In some embodiments, the array common source 764-1, 764-2, 764-3, . . . , can be electrically connected with each other and shared by the memory strings 212 in an entire memory block. Thus, in some embodiments, the array common source 764 is also referred to as the common source line. In this example, the TSG 334 and LSG 332 need to be addressed coordinately to support reading, programing (i.e., writing) and inhibiting operations of a target memory cell (e.g., the ferroelectric memory cell 540-*b*-2).

Referring to FIGS. 5 and 7, in the 3D Fe-NAND memory array 700, read and write operations can be performed in a memory page 764, which includes memory cells sharing the same word line (e.g., word line 333-*a* shown in FIG. 7). In the 3D Fe-NAND memory array 700, each ferroelectric memory cell 540 can be programmed to a logic state of "0" or "1." Initially, the ferroelectric film 552 in all ferroelectric memory cells 540 can have zero polarization and can be set or reset to logic state "1" or "0," as previously discussed for the ferroelectric memory cell 540 in FIG. 5. At the logic state of "1," the ferroelectric memory cell 540 can be set to the lower threshold voltage $V_{th\_L}$, and the current flowing through the ferroelectric memory cells 540 between the source terminal (connected to the array common source 764) and the drain terminal (connected to the bit lines 341) can be at a higher level for a given bias on the word line. At the logic state of "0," the ferroelectric memory cells 540 can be reset to the higher threshold voltage $V_{th\_H}$, (i.e., $V_{th\_H} > V_{th\_L}$) and the current flowing through the ferroelectric memory cells 540 between the source terminal and the drain terminal can be at a lower level for a given bias on the word line. By measuring (i.e., reading) the current that flows through the source and drain terminals of a selected memory cell, the threshold voltage $V_{th\_H}$ or $V_{th\_L}$ and thereby the logic state (or programmed data) of the ferroelectric memory cell 540 can be determined accordingly. In some embodiments, the higher and lower threshold voltages $V_{th\_H}$ and $V_{th\_L}$ can be in a range between about −3V to about 3V.

For example, to read the data in the target memory cell 540-*b*-2 shown in FIG. 7, which is connected with the word line 333-*b* and the bit line 341-2, the corresponding TSG 334-2 and the LSG 332-2 of a selected memory string 212-2 can be applied with a top select gate voltage $V_{tsg}$ and a lower select gate voltage $V_{lsg}$ to switch on a corresponding top select transistor 334-T and a lower select transistor 332-T. In this example, a current path through the ferroelectric memory cell 540-*b*-2 can be established for the selected memory string 212-2. The current flowing through the selected memory string 212-2 can be detected from the bit line 341-2 and the array common source 764-2 that are electrically connected with the selected memory string 212-2.

In order to read the storage data in the target memory cell (e.g., the ferroelectric memory cell 540-*b*-2), the TSG of unselected memory strings, for example TSG 334-1 of memory string 212-1 in FIG. 7, can be applied with an off voltage ($V_{off}$) to switch off a corresponding top select transistor (e.g., 334-T-1). A current path between the unselected memory string 212-1 and bit line 341-1 can thereby be disconnected. In this example, storage data can be read from one memory cell 540 at a time.

In some embodiments, the TSGs 334 and LSGs 332 of the unselected memory strings 212 can also be applied with the top select gate voltage $V_{tsg}$ and the lower select gate voltage $V_{lsg}$, respectively, to switch on the corresponding top select transistors 334-T and lower select transistor 332-T, and to establish conductive paths between the bit lines 341 and the unselected memory strings 212. In this example, data stored in the ferroelectric memory cells 540 in the same memory page (e.g., 540-*b*-1, 540-*b*-2, 540-*b*-3, . . . ) can be measured simultaneously at respective bit lines 341 by applying the reading voltage $V_{read}$ at the shared word line 333-*b*. In this example, storage data can be read simultaneously from all the memory cells 540 in one memory page 764.

To read the target memory cell 540-*b*-2 in the selected memory string 212-2, a selected word line (e.g., word line 333-*b*) can be applied with the read voltage $V_{read}$, while other word lines that are not selected (e.g., word line 333-*a* and 333-*c*) can be applied with a pass voltage $V_{pass}$. The pass voltage $V_{pass}$ can be higher than the highest threshold voltage of all the ferroelectric memory cells 540 such that all the other ferroelectric memory cells 540 on the selected memory string 212-2 can be fully switched on. The read voltage $V_{read}$ applied on the selected word line 333-*b* can be adjusted for sensing (i.e., reading or measuring) the threshold voltage of the target memory cell 540-*b*-2. In some embodiments, the read voltage $V_{read}$ can have a value in between the lower and higher threshold voltages $V_{th\_L}$ and $V_{th\_H}$, i.e., $V_{th\_L} < V_{read} < V_{th\_H}$. For example, if $V_{th\_L} = -2.5V$ and $V_{th\_H} = -1.5V$, the read voltage $V_{read}$ can be in a range between about −2.5V and about −1.5V. As an example, the read voltage $V_{read}$ can be −2.0 V and the pass voltage $V_{pass}$ can be 0 V. If the target memory cell 540-*b*-2 is at the logic state of "1" having the lower threshold voltage $V_{th\_L}$, the target memory cell 540-*b*-2 can be switched on when applying the read voltage $V_{read} = -2.0$ V on the word line 333-*b*. Then, the top and lower select transistors 334-T-2 and 332-T-2, and all the memory cells 540 in the selected memory string 212-2 are switched on. Higher level of current flows between the bit line 341-2 and the array common source 764-2 with a conductive path having a lower resistance. If the target memory cell 540-*b*-2 is at the logic state of "0" with the higher threshold voltage $V_{th\_H}$, the target memory cell 540-*b*-2 can be switched off when applying the read voltage $V_{read} = -2.0$ V on the word line 333-*b* as used in the example above. Under this operation condition, even though the top and lower select transistors 334-T-2 and 332-T-2, and all the other memory cells 540 of the selected memory string 212-2 are switched on, the target memory cell 540-*b*-2 is switched off. Lower level of current flows between the bit line 341-2 and the array common source 764 with a conductive path having a higher resistance. By measuring the current at bit line 341-2, the logic state of the target memory cell 540-*b*-2 can be determined.

During the current measurement, a sensing voltage $V_{sensing}$ can be applied to the bit line 341-2, while the array common source 764-2 can be grounded (i.e., kept at 0V). To avoid disturbing the polarization of the ferroelectric film 552 in the ferroelectric memory cell 540, the read voltage $V_{read}$ and the pass voltage $V_{pass}$ should be less than the coercive voltage V. For example, in some embodiments, if the coercive voltage $V_c$=3.0V, the read voltage $V_{read}$ and the pass voltage $V_{pass}$ can range between about −3.0V and about 3.0V. The sensing voltage $V_{sensing}$ applied to the bit line for sensing (or reading) the current can be low enough without causing significant potential change in the channel layer 338. The resistance of the target memory cell 540-b-2 can be extracted from the measured current and the sensing voltage $V_{sensing}$. In some embodiments, the sensing voltage $V_{sensing}$ can be in a range between about 0.1V to about 0.5V. As described above, the logic states of "0" and "1" of the target memory cell 540-b-2, based on threshold voltages of $V_{th\_H}$ and $V_{th\_L}$, can be determined accordingly.

Figure 8:
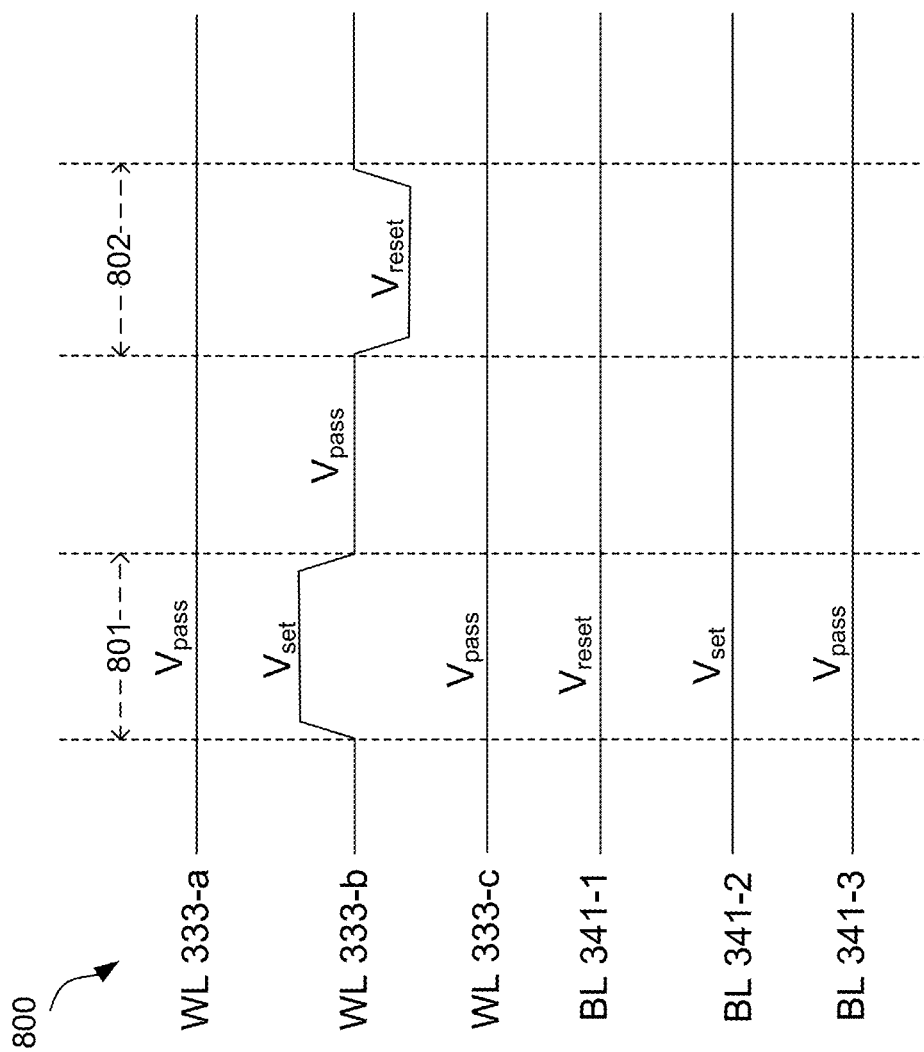
FIGS. 8-10 illustrate wave forms of writing operations, according to some embodiments of the present disclosure.

FIG. 8 illustrates a wave form of a writing operation 800 for the 3D Fe-NAND memory array 700 in FIG. 7, according to some embodiments of the present disclosure. During the writing operation 800, the array common source 764 in FIG. 7 (e.g., 764-1, 764-2, 764-3, . . . ) can be disconnected from the respective memory string 212 (e.g., 212-1, 212-2, 212-3, . . . ) by applying the off voltage $V_{off}$ on the LSG 332 to switch off the lower select transistor 332-T. In some embodiments, the array common source 764 can also be biased at the same voltage as the corresponding bit line 341.

During the writing operation 800, the TSG 334 of the selected and unselected memory strings 212 can all be applied with the top select gate voltage $V_{tsg}$ to switch on the corresponding top select transistors 334-T and establish a conductive path between the bit line 341 and the corresponding memory string 212. In this example, the ferroelectric memory cells 540-b-1, 540-b-2, 540-b-3, . . . , in the same memory page 764 can be programmed (or written) according to the voltage applied on the respective bit lines 341-1, 341-2, 341-3, . . . .

For example, to write the ferroelectric memory cell 540-b-1 in the memory string 212-1, unselected word lines (e.g., word line 333-a and 333-c) can be applied with the pass voltage $V_{pass}$ such that all the unselected memory cells 540 on the memory string 212-1 can be fully switched on. In this example, upper memory cells located between the ferroelectric memory cell 540-b-1 and the bit line 341-1 are switched on when the pass voltage $V_{pass}$ is applied on each unselected word lines 333 (e.g., WL 333-a). A conductive path is therefore established between the drain terminal of the ferroelectric memory cell 540-b-1 and the bit line 341-1. The drain terminal of the ferroelectric memory cell 540-b-1 can have the same electric potential (or voltage) as the bit line 341-1. The voltage difference between the control gate 333-b and the drain terminal of the ferroelectric memory cell 540-b-1 can be the same as the voltage difference between the word line 333-b and the bit line 341-1. Thus, by controlling the voltage difference between the word line 333-b and the bit line 341-1, an externally applied electrical field can be controlled across the ferroelectric film 552 (see FIG. 5) in the ferroelectric memory cell 540-b-1, which can be used to switch the polarization direction of the ferroelectric film 552, i.e., to set or reset the logic states of "1" or "0" for the ferroelectric memory cell 540-b-1.

As shown in FIG. 8, during a time period 801, the selected word line 333-b can be applied with a set voltage $V_{set}$. In the meantime, the bit lines 341-1, 341-2, 341-3 can be respectively biased at a reset voltage $V_{reset}$, the set voltage $V_{set}$ and the pass voltage $V_{pass}$. The voltage difference between the word line 333-b and bit line 341-1 is $V_{set}-V_{reset}$. In some embodiment, the set voltage $V_{set}$ and the reset voltage $V_{reset}$ can be selected such that the difference between $V_{set}$ and $V_{reset}$ (i.e., $V_{set}-V_{reset}$) is larger than the coercive voltage $V_c$ of the ferroelectric memory cell 540 (i.e., $V_{set}-V_{reset}>V_c$). Under this condition, the ferroelectric film 552 of the ferroelectric memory cell 540-b-1 can be positively polarized and the ferroelectric memory cell 540-b-1 can be set to the lower threshold voltage $V_{th\_L}$ and programmed to logic state of "1." In some embodiments, the set voltage $V_{set}$ and the reset voltage $V_{reset}$ can have a magnitude being half of the programming voltage $V_p$, i.e., $V_{set}=+V_p/2$ and $V_{reset}=-V_p/2$. For example, if $V_p$=4.0V, and $V_c$=3.0V, then the set voltage $V_{set}$=2.0V and the reset voltage $V_{reset}$=−2.0V, and $V_{set}-V_{reset}$=4.0V=$V_p$. In some embodiments, the set and reset voltages can be voltage pulses with durations in a range between 10 ns to 100 µs. In some embodiments, the set and reset voltages have magnitudes in a range between about 1.5V to about 5V. Under this condition, the ferroelectric memory cell 540-b-1 can be programmed to logic state of "1."

In the meantime, the word line 333-b and the bit line 341-2 can be both biased at the set voltage $V_{set}$ and the voltage difference between the word line 333-b and the bit line 341-2 is zero. Thus, the polarization direction of the ferroelectric film 552 in the ferroelectric memory cell 540-b-2 cannot be switched and the ferroelectric memory cell 540-b-2 is not programmed or written under this condition, i.e., is inhibited from being programmed. Similarly, the voltage difference between the word line 333-b and the bit-line 341-3 can be $V_{set}-V_{pass}$. In some embodiment, the set voltage $V_{set}$ and the pass $V_{pass}$ can be selected such that the voltage difference between the set voltage $V_{set}$ and the pass $V_{pass}$ (i.e., $V_{set}-V_{pass}$) can be smaller than the coercive voltage $V_c$, and larger than the reversed coercive voltage $-V_c$, i.e., $-V_c<V_{set}-V_{pass}<V_c$. For example, in the example above, if $V_{pass}$=0, then $V_{set}-V_{pass}=+V_p/2$=2.0V, while ±$V_c$=±3.0V. Under this condition, the polarization direction of the ferroelectric film 552 in the ferroelectric memory cell 540-b-3 cannot be switched and the logic states remain as the same as previous ones. The ferroelectric memory cell 540-b-3 is not programmed or written, i.e., is inhibited from being programmed.

Similarly, the ferroelectric memory cells 540 controlled by the unselected word lines 333 cannot be programmed or written (i.e., are inhibited) because the voltage difference between the corresponding word line and bit line is less than the coercive voltage $V_c$ and larger than the reversed coercive voltage $-V_c$. For example, the voltage difference between the word line 333-a and the bit lines 341-1, 341-2 and 341-3 are $V_{pass}-V_{reset}$, $V_{pass}-V_{set}$ and zero, respectively. In the example above, $V_{pass}-V_{reset}$=2.0V, $V_{pass}-V_{set}$=−2.0V, all smaller than the coercive voltage (e.g., $V_c$=3.0V) and larger than the reversed coercive voltage (e.g., $-V_c$=−3.0V). Thus, these ferroelectric memory cells 540 on the unselected word lines 333 are not disturbed and not programmed.

By applying a different voltage on the selected word line, a different memory cell in the same memory page can be programmed. In FIG. 8, the writing operation 800 also includes a time period 802, where the voltage on the selected word line 333-b is changed to the reset voltage $V_{reset}$ and the voltages of the bit lines 341-1, 341-2 and 341-3, and unselected word lines 333-a, 333-b, . . . are not changed. Under this condition, the voltage difference between the selected word line 333-b and the bit-lines 341-1, 341-2 and 341-3 are now zero, $V_{reset}-V_{set}$ and $V_{reset}-V_{pass}$, respectively. In some embodiment, the reset voltage $V_{reset}$ and the pass $V_{pass}$ can be selected such that the voltage difference $V_{reset}-V_{pass}$ is larger than the reversed coercive voltage $-V_c$ and smaller than the coercive voltage $V_c$, i.e., $-V_c<V_{reset}-V_{pass}<V_c$. In the example discussed previously when $\pm V_c=\pm 3.0V$, $V_{reset}=-2.0V$ and $V_{pass}=0V$, the voltage different of $V_{reset}-V_{pass}=-2.0V$, in between $\pm V_c$. Under this condition, the polarization direction of the ferroelectric films 552 in the ferroelectric memory cells 540-b-1 and 540-b-3 cannot be switched and the logic states remain as the same as previous ones. The ferroelectric memory cells 540-b-1 and 540-b-3 are not programmed or written (i.e., is inhibited). Meanwhile, the voltage difference of $V_{reset}-V_{set}$ can be smaller than the negative coercive voltage $-V_c$, i.e., $V_{reset}-V_{set}<-V_c$ or the voltage difference is negative and has a magnitude larger than the coercive voltage $V_c$, i.e., $|V_{set}-V_{reset}|\geq V_c$. In the example discussed previously, the voltage difference of $V_{reset}-V_{set}=-4.0V<-V_c$, or $|V_{set}-V_{reset}|=4.0V\geq V_c$. In the other words, the voltage difference between the word line 333-b and the bit line 341-1 is negative with a magnitude large enough to create a reverse electric field stronger than the reversed coercive electric field. Therefore, the polarization direction in the ferroelectric film 552 of the ferroelectric memory cell 540-b-1 is switched from positive to negative and the threshold voltage of the FeFET 540-b-1 is changed from the lower threshold voltage $V_{th\_L}$ to the higher threshold voltage $V_{th\_H}$. The ferroelectric memory cell 540-b-1 is thus programmed to logic state of "0."

As discussed previously, the ferroelectric memory cells 540 on the unselected word lines 333-a, 333-c, . . . , are not disturbed or programmed because the voltage difference between the corresponding word line and bit line is in between the coercive voltage $V_c$ and the reversed coercive voltage $-V_c$, i.e., the magnitude is not large enough to switch the polarization direction in the ferroelectric film.

As shown in the writing operation 800, by designing a suitable wave form, the ferroelectric memory cells 540 on the same selected word line can be programmed to the logic state of "0" or "1," without changing the applied voltages on the bit line. The memory cells on the unselected word line can be inhibited from programming and remain at previous logic state.

Figure 9:
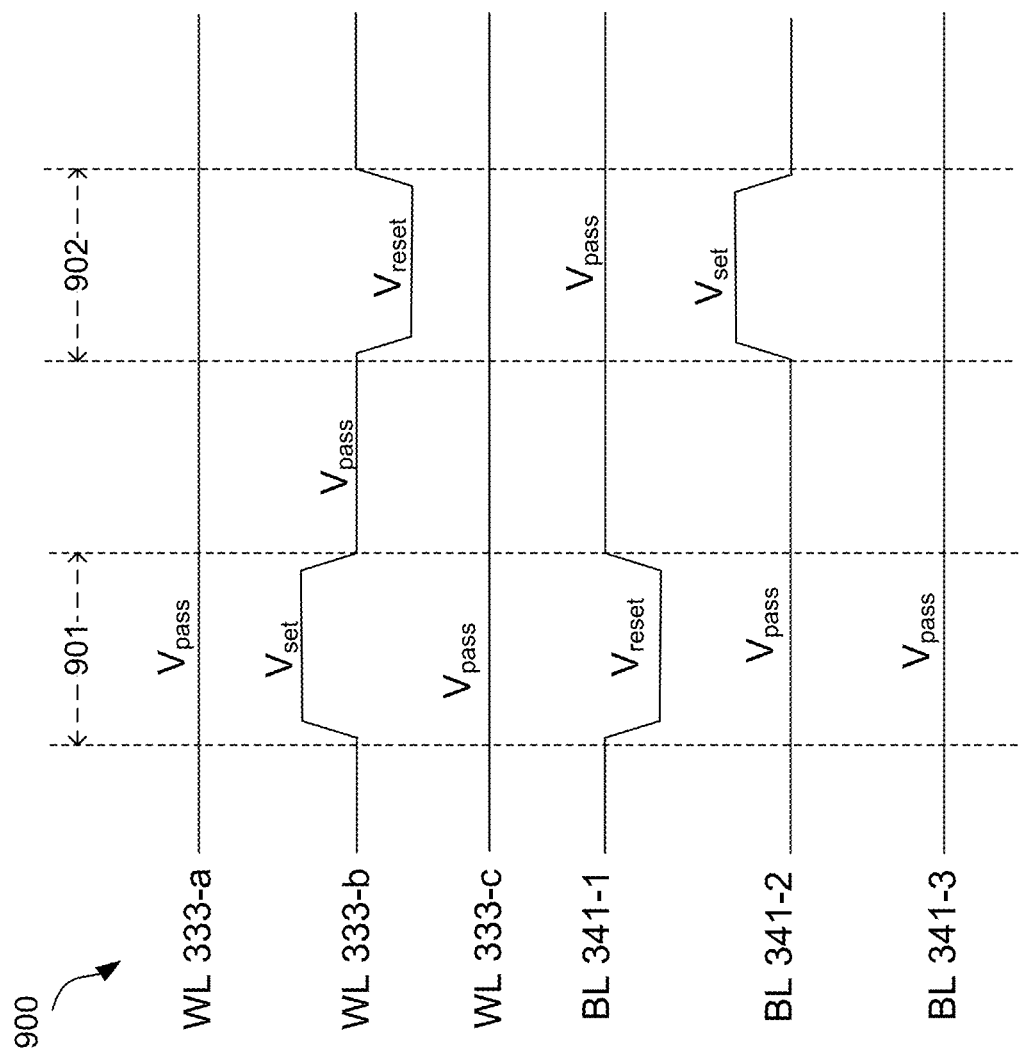

FIG. 9 illustrates a wave form of a writing operation 900 for the 3D Fe-NAND memory array 700 in FIG. 7, according to some embodiments of the present disclosure. The writing operation 900 is similar to the writing operation 800. The difference is that the bit line 341-1 is only biased at the reset voltage $V_{reset}$ during a time period 901, and is biased at the pass voltage $V_{pass}$ for the other time period of the writing operations 900. Similarly, the bit line 341-2 is only biased at the set voltage $V_{set}$ during a time period 902, and is biased at the pass voltage $V_{pass}$ for the other time period of the writing operations 900. Therefore, the writing operation 900 effectively programs the ferroelectric memory cell 540-b-1 to logic state of "1" during the time period 901 and programs the ferroelectric memory cell 540-b-2 to logic state of "0" during the time period 902, based on the same applied voltages and same method as discussed previously for writing operation 800. Same as the condition in the writing operation 800, the ferroelectric memory cell 540-b-3 is also inhibited from programming and remains at its logic state.

During the time period 901, both the bit lines 341-2 and 341-3 are biased at the pass voltage $V_{pass}$. The ferroelectric memory cell 540-b-2 and 540-b-3 are inhibited from programming, as discussed previously for the writing operation 800. Similarly, during the time period 902, both the bit lines 341-1 and 341-3 are biased at the pass voltage $V_{pass}$. For the same reason, the ferroelectric memory cell 540-b-1 and 540-b-3 are inhibited from programming.

Figure 10:
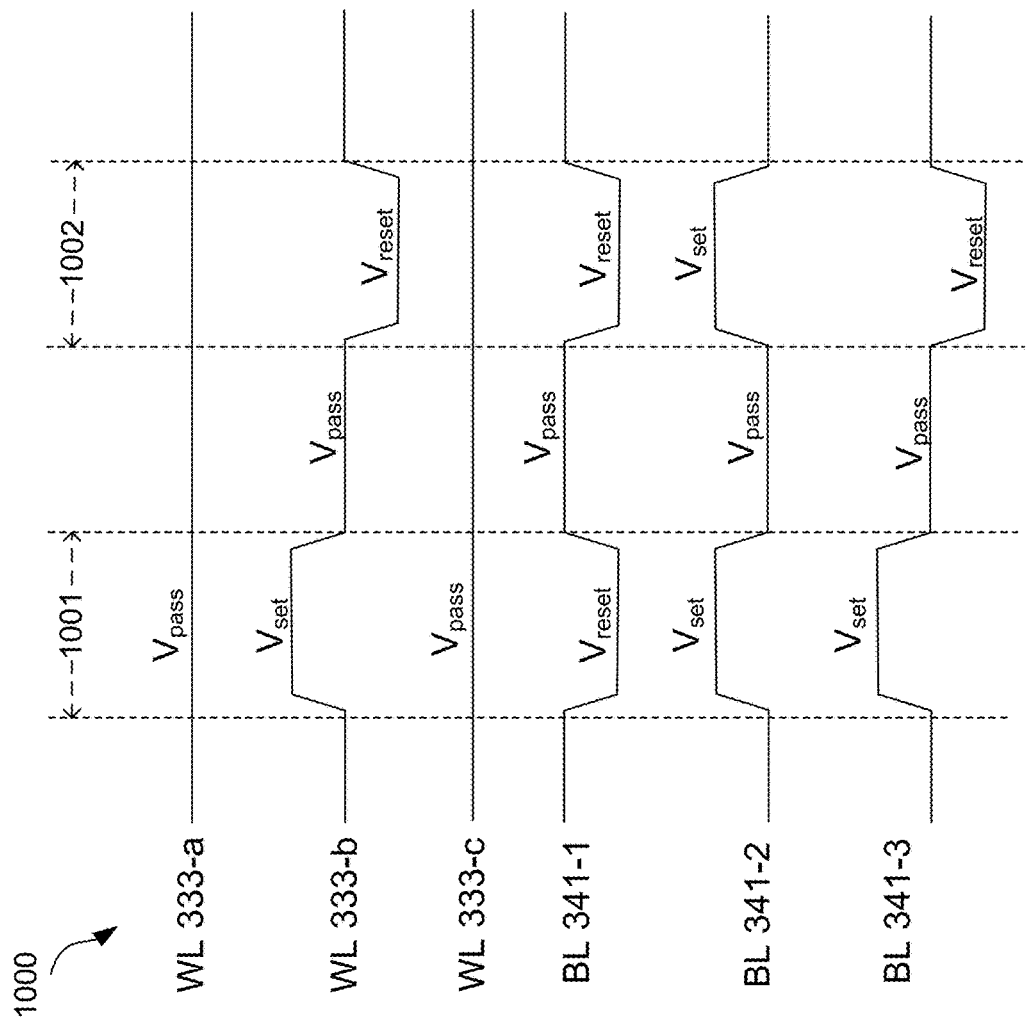

FIG. 10 illustrates a wave form of a writing operation 1000 for the 3D Fe-NAND memory array 700 in FIG. 7, according to some embodiments of the present disclosure. The writing operation 1000 is similar to the writing operations 800 and 900. The difference is that the bit line 341-1 is biased at the reset voltage $V_{reset}$ during a time period 1001 and a time period 1002, and the bit line 341-2 is biased at the set voltage $V_{set}$ during both the time periods 1001 and 1002. As for the bit line 341-3, it is biased with the set voltage $V_{set}$ during the time period 1001 and biased with a reset voltage $V_{reset}$ at the time period 1002. During other time period of the writing operations 900, the bit lines 341 are biased at the pass voltage $V_{pass}$.

The writing operation 1000 effectively programs the ferroelectric memory cell 540-b-1 to logic state of "1" during the time period 1001 and programs the ferroelectric memory cell 540-b-2 to logic state of "0" during the time period 1002, based on the same applied voltages and same method as discussed previously for writing operations 800 and 900. During the time period 1001 when the ferroelectric memory cells 540-b-1 is programmed to the logic state of "1," the voltage difference between the selected word line 333-b and the bit lines 341-2 and 341-3 remain zero. Similarly, during the time period 1002 when the ferroelectric memory cells 540-b-2 is programmed to the logic state of "0," the voltage difference between the selected word line 333-b and the bit line 341-1 and 341-3 also remains zero. In the other words, the inhibited memory cells are biased with the same voltage as the selected word line during programming, which can keep the voltage difference between the word line and bit line at zero and reduce the possibility of switching the polarization or logic state of these inhibited memory cells during programming of other memory cells on the same word line.

In the present disclosure, methods of writing a 3D Fe-NAND memory are disclosed. by applying the set voltage and reset voltage on the respective selected word line and selected bit line, and generating a voltage difference between the control gate and the drain terminal of the target memory cell with a magnitude larger than the coercive voltage of the ferroelectric film in the target memory cell, the logic state of the target memory cell can be switched from "0" to "1" or vice versa without the risk of disturbing the unselected or inhibited ferroelectric memory cells. In some embodiments, the set voltage and reset voltage can have opposite signs (i.e., positive versus negative), and have magnitudes being half of the programming voltage. Accordingly, electric stress from a single large voltage pulse applied on the ferroelectric memory cell can be avoided. In addition, by applying the same voltage on the word line and bit line for unselected or inhibited memory cells, the reduction of the electric stress can be optimized. In addition, the reading and writing methods presented in this disclosure enable quick reading and writing with a high throughput, i.e., memory page by memory page. Furthermore, the ferroelectric memory cells can be sensed and programmed at bit-level. High voltage erasing for traditional 3D NAND memory is eliminated.

In summary, the present disclosure provides a reading method of a three-dimensional ferroelectric memory device. The reading method includes applying a read voltage on a selected word line of a target memory cell. The target memory cell has two logic states corresponding to a higher threshold voltage and a lower threshold voltage that are determined by two opposite electric polarization directions of a ferroelectric film in the target memory cell. The read voltage is smaller than the higher threshold voltage and is larger than the lower threshold voltage. The reading method further includes measuring an electric current that flows through the target memory cell.

The present disclosure also provides a programming method of a three-dimensional ferroelectric memory device. The programming method includes applying a first voltage on a selected word line of a target memory cell. The target memory cell includes a first logic state and a second logic state corresponding to a first threshold voltage and a second threshold voltage, respectively. The first and second threshold voltages are determined by two opposite electric polarization directions of a ferroelectric film in the target memory cell. The programming method also includes applying a second voltage on a selected bit line that is connected to a drain terminal of the target memory cell. A voltage difference between the first and second voltages has a magnitude larger than a coercive voltage of the ferroelectric film to switch the target memory cell from the first logic state to the second logic state.

The present disclosure further provides a three-dimensional ferroelectric memory device. The memory cell of the three-dimensional ferroelectric memory device comprises a ferroelectric film. The memory cell comprises a first logic state and a second logic state corresponding to a first threshold voltage and a second threshold voltage, respectively. The first and second threshold voltages can be determined by two opposite electric polarization directions of the ferroelectric film. The memory cell is configured to be programmed by applying a first voltage on a selected word line and applying a second voltage on a selected bit line, wherein a voltage difference between the first voltage and the second voltage comprises a magnitude larger than a coercive voltage of the ferroelectric film to switch the memory cell from the first logic state to the second logic state.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional ferroelectric NAND memory device, comprising:
   a film stack, comprising conductive layers and dielectric layers alternatingly stacked on a substrate in a first direction perpendicular to the substrate;
   a memory string penetrating through the film stack in the first direction, wherein the memory string comprises:
   a channel layer extending through the film stack in the first direction;
   a ferroelectric film disposed on a sidewall of the channel layer; and
   a ferroelectric memory cell formed at an intersection between the conductive layer, the ferroelectric film and the channel layer in a second direction parallel to the substrate, wherein:
   the ferroelectric memory cell comprises a first logic state and a second logic state corresponding to a first threshold voltage and a second threshold voltage, respectively;
   the first threshold voltage is determined by a first electric polarization direction of the ferroelectric film; and
   the second threshold voltage is determined by a second electric polarization direction of the ferroelectric film, opposite to the first electric polarization direction.

2. The three-dimensional ferroelectric NAND memory device of claim 1, wherein the ferroelectric film comprises a high-k dielectric material.

3. The three-dimensional ferroelectric NAND memory device of claim 2, wherein the high-k dielectric material of the ferroelectric film comprises hafnium oxide ($HfO_2$), aluminum oxide ($Al_2O_3$), zirconium oxide ($ZrO_2$), titanium oxide ($TiO_2$), niobium oxide ($Nb_2O_5$), tantalum oxide ($Ta_2O_5$), tungsten oxide ($WO_3$), molybdenum oxide ($MO_3$), vanadium oxide ($V_2O_3$), lanthanum oxide ($La_2O_3$), and/or any combination thereof.

4. The three-dimensional ferroelectric NAND memory device of claim 1, wherein the ferroelectric film comprises a thickness between 5 nm and 100 nm.

5. The three-dimensional ferroelectric NAND memory device of claim 1, wherein the channel layer comprises polycrystalline silicon.

6. The three-dimensional ferroelectric NAND memory device of claim 1, wherein the memory string further comprises a core filling film at a center extending through the film stack in the first direction, wherein the core filling film is surrounded by the channel layer.

7. The three-dimensional ferroelectric NAND memory device of claim 1, wherein the memory string further comprises an interface layer located between the ferroelectric film and the channel layer, the interface layer extending through the film stack in the first direction.

8. The three-dimensional ferroelectric NAND memory device of claim 7, wherein the interface layer comprises a thickness between 5 nm and 50 nm.

9. The three-dimensional ferroelectric NAND memory device of claim 7, wherein the interface layer comprises silicon oxide, silicon nitride, silicon oxynitride, high-k dielectric material, and/or any combination thereof.

10. The three-dimensional ferroelectric NAND memory device of claim 7, wherein the memory string further comprises a bottom electrode located between the ferroelectric film and the interface layer, the bottom electrode extending through the film stack in the first direction.

11. The three-dimensional ferroelectric NAND memory device of claim 1, wherein the first electric polarization direction points from the channel layer to the conductive layer, and the second electric polarization direction points from the conductive layer to the channel layer.

12. The three-dimensional ferroelectric NAND memory device of claim 11, wherein the first logic state is 0 and the second logic state is 1.

13. The three-dimensional ferroelectric NAND memory device of claim 11, wherein the first threshold voltage is higher than the second threshold voltage.

14. A three-dimensional ferroelectric NAND memory device, comprising:
- a plurality of ferroelectric memory cells stacked in a first direction perpendicular to a substrate;
- a plurality of word lines extending in a second direction parallel to the substrate;
- a top select transistor configured to connect the plurality of ferroelectric memory cells to a bit line; and
- a lower select transistor configured to connect the plurality of ferroelectric memory cells to an array common source, wherein each of the plurality of ferroelectric memory cells comprises:
  - a ferroelectric film positioned between a corresponding word line and a channel layer; and
  - a first logic state and a second logic state corresponding to a first threshold voltage and a second threshold voltage, respectively, wherein the first threshold voltage and the second threshold voltage are determined by two opposite electric polarization directions of the ferroelectric film.

15. The three-dimensional ferroelectric NAND memory device of claim 14, wherein the ferroelectric film comprises a high-k dielectric material.

16. The three-dimensional ferroelectric NAND memory device of claim 15, wherein the high-k dielectric material of the ferroelectric film comprises hafnium oxide ($HfO_2$), aluminum oxide ($Al_2O_3$), Zirconium oxide ($ZrO_2$), titanium oxide ($TiO_2$), niobium oxide ($Nb_2O_5$), tantalum oxide ($Ta_2O_5$), tungsten oxide ($WO_3$), molybdenum oxide ($MO_3$), vanadium oxide ($V_2O_3$), lanthanum oxide ($La_2O_3$), and/or any combination thereof.

17. The three-dimensional ferroelectric NAND memory device of claim 15, wherein the ferroelectric film comprises a thickness between 5 nm and 100 nm.

18. The three-dimensional ferroelectric NAND memory device of claim 14, wherein each of the plurality of ferroelectric memory cells further comprises an interface layer located between the ferroelectric film and the channel layer.

19. The three-dimensional ferroelectric NAND memory device of claim 18, wherein each of the plurality of ferroelectric memory cells further comprises a bottom electrode located between the ferroelectric film and the interface layer.

* * * * *